United States Patent [19]

Ishitani et al.

[11] Patent Number: 4,710,632
[45] Date of Patent: Dec. 1, 1987

[54] ION MICROBEAM APPARATUS

[75] Inventors: Tohru Ishitani, Sayama; Hideo Todokoro, Nishitama; Yoshimi Kawanami, Kokubungi; Hifumi Tamura, Hachioji, all of Japan

[73] Assignee: Hitachi, Ltd., Tokyo, Japan

[21] Appl. No.: 733,632

[22] Filed: May 13, 1985

[30] Foreign Application Priority Data

May 18, 1984 [JP] Japan ................ 59-98712

[51] Int. Cl.$^4$ ............ H01J 37/04; H01J 37/10
[52] U.S. Cl. ............... 250/396 R; 250/398; 250/492.2
[58] Field of Search ........ 250/492.21, 492.23, 250/309, 310, 396 R, 398, 492.2, 492.3

[56] References Cited

U.S. PATENT DOCUMENTS

| 3,547,074 | 12/1970 | Hirschfield | 250/398 |
| 4,085,330 | 4/1978 | Wolfe | 250/492.21 |
| 4,358,338 | 11/1982 | Downey et al. | 156/627 |
| 4,503,329 | 3/1985 | Yomaguchi et al. | 250/309 |
| 4,556,798 | 12/1985 | McKenna et al. | 250/396 R |

FOREIGN PATENT DOCUMENTS

| 0004064 | 9/1979 | European Pat. Off. | 250/492.21 |
| 0082640 | 6/1983 | European Pat. Off. | |
| 0093868 | 11/1983 | European Pat. Off. | |
| 0100634 | 2/1984 | European Pat. Off. | 250/492.3 |
| 0161612 | 11/1985 | European Pat. Off. | 250/396 R |
| 0081749 | 5/1986 | Japan | 250/396 R |

OTHER PUBLICATIONS

Patent Abstracts of Japan, unexamined applications, E section, vol. 8, No. 25, Feb. 2, 1984.

Primary Examiner—Carolyn E. Fields
Assistant Examiner—Paul A. Guss
Attorney, Agent, or Firm—Antonelli, Terry & Wands

[57] ABSTRACT

The invention is concerned with a power supply for the lens for fine adjustment among the beam-focusing lenses in an ion microbeam apparatus, and is concerned with the control thereof. In this ion microbeam apparatus, the power supply is provided for the lens for fine adjustment in addition to the power supply for the lens for rough adjustment. The power supply is served with a potential that so controls the beam as to have an optimum diameter, responsive to the signals from the ion beam detector and from the beam deflector means.

8 Claims, 3 Drawing Figures

ION MICROBEAM APPARATUS

BACKGROUND OF THE INVENTION

The present invention relates to an ion microbeam apparatus which is used for the lithography or implantation utilizing an ion microbeam, and particularly to an ion microbeam apparatus which makes it possible to adjust the beam diameter as well as to effect auto-focusing.

FIG. 1 shows the fundamental construction of a conventional ion microbeam apparatus. Such a conventional apparatus has been disclosed, for example, in a literature "Shinku (Vacuum)", Vol. 25, No. 6, pp. 439–447. A voltage of about 10 KV is applied across an emitter 1 of an ion source and an ion-extracting electrode 2 by an ion-extracting power supply 3 in order to extract ions from the emitter 1. The ions extracted from the emitter 1 are accelerated to about 100 KV by an ion-accelerating power supply 4. The ions are focused on a sample 7 by electrostatic lenses 5a, 5b, 5c. The focused beam performs the scanning owing to a deflector 8 controlled by a scan controller 10. The electrostatic lens 5 consists of two or more electrodes. In the following description, use is made of an Einzel lens which consists of three electrodes. In this electrostatic lens, the electrodes 5a, 5c at both ends are maintained at ground potential, and a high voltage of about 80 KV is applied to the central electrode 5b from a lens power supply 9.

The sample 7 irradiated with the ion beam emits secondary electrons 11 that will be detected by a secondary electron detector 12. A secondary-electron-image observation unit 13 under control of the scan controller 10 observes the data related to the surfaces of sample such as ruggedness of surfaces, and monitors the diameter of the beam. In the ion microbeam apparatus as mentioned above, the beam having a fine diameter is obtained in observing the samples. Namely, the beam is correctly focused on the sample 7 by the lens 5. For this purpose, the lens voltage $V_L$ is scanned over a range of about 100 volts to hover around an optimum lens voltage, and a minimum beam diameter is looked for while monitoring the beam diameter.

According to the conventional apparatus, however, a time of longer than about 10 seconds is required to scan a range of as narrow as about ±100 volts maintaining a precision of 0.5 volt or smaller with the lens power supply 9 of a voltage of as high as about 100 KV, because of its large time constant. Therefore, it is difficult to accomplish the focusing at a reduced period of time. In the conventional apparatus, this difficulty is always involved even when the lens system of a plurality of stages is employed, or even when a mass separator is installed in an ion optical system to separate ions into those of different kinds.

SUMMARY OF THE INVENTION

The object of the present invention is to provide an ion microbeam apparatus which is capable of correctly and quickly adjusting the diameter of an ion microbeam to focus it on a sample.

The present invention is to achieve the above-mentioned object, and its feature resides in an ion microbeam apparatus which comprises an ion source, an acceleration power supply for accelerating the ions extracted from said ion source, a first lens for roughly adjusting the focusing of the accelerated ions, a first power supply for supplying a potential to said first lens, a second lens which is provided in the proximity of said first lens and which finely adjusts the focusing of ions, means for measuring the diameter of an ion beam that falls on a sample, and a second power supply which supplies a potential to said second lens responsive to signals from said means for measuring the ion beam diameter, so that the ion beam assumes an optimum diameter.

DETAILED DESCRIPTION OF THE PREFERRED EMBODIMENTS

Figure 1:
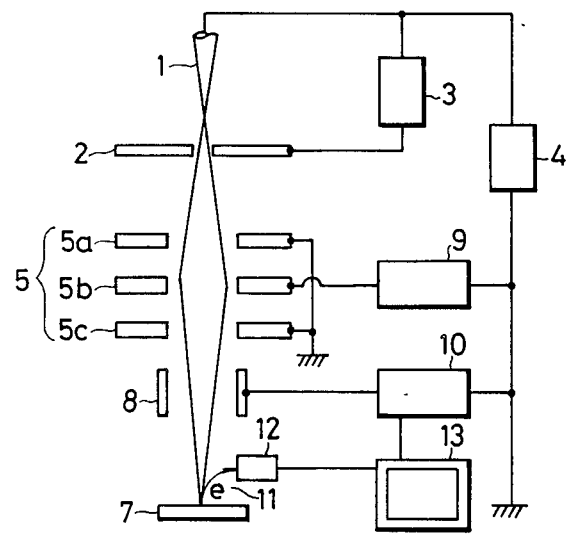
FIG. 1 is a diagram illustrating the fundamental construction of a conventional ion microbeam apparatus.
Figure 2:
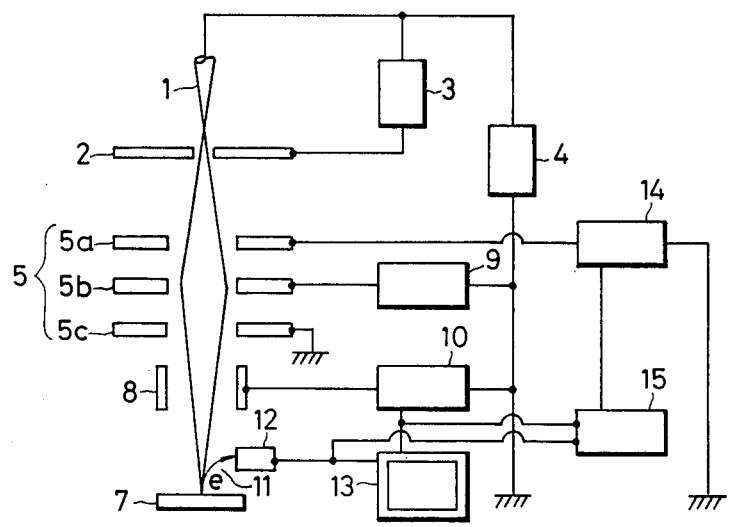
FIGS. 2 and 3 are diagrams illustrating ion microbeam apparatuses according to different embodiments of the present invention.

An embodiment of the present invention will be described below in conjunction with FIG. 2. An ion beam 1 is focused on a sample 7 by an electrostatic lens 5 which consists of three electrodes 5a, 5b, 5c. A potential close to an optimum potential is applied to an intermediate electrode 5b from a lens power supply 9 to roughly adjust the focusing. Then, a potential $\Delta V_L$ is applied from an auxiliary lens power supply 14 to a first electrode 5a which is one of the ground-side electrodes 5a, 5c of the lens 5, in order to finely adjust the beam focusing. The beam diameter is measured by a beam control unit 15 by detecting the secondary electrons 11 emitted from the sample 7 using a detector 12 and comparing them with beam scanning signals. The output voltage of the auxiliary lens power supply 14 is so controlled that the ion beam will have an optimum diameter by the control signals produced by the beam control unit 15 depending upon the beam diameter.

In this embodiment which makes use of a gallium liquid metal ion source, the potential of lens electrode 5b is roughly adjusted to 81.3 KV to focus the Ga$^+$ beam that is accelerated at 100 KV. Then, the potential $\Delta V_L$ is applied to the lens electrode 5a from the auxiliary lens power supply 14, and is scanned from $-100$ volts to $+100$ volts so that the Ga$^+$ beam assumes a minimum diameter of 0.52 $\mu$m. The potential $\Delta V_L$ at this moment is 32.3 volts, and the beam current is 0.38 nA. The time for obtaining the minimum beam diameter is 0.95 second; i.e., the focusing is accomplished quickly.

Figure 3:
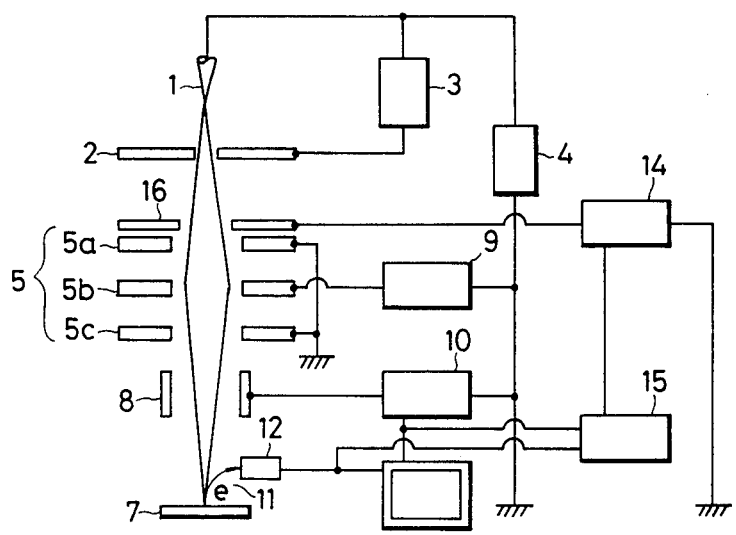

Another embodiment will be explained below in conjunction with FIG. 3. According to this embodiment, an auxiliary electrode 16 is provided just over the groundside electrode 5a of the lens 5, and is served with the potential $\Delta V_L$ from the auxiliary lens power supply 14. The beam diameter is measured by the beam control unit 15 by detecting the secondary electrons 11 emitted from the sample using the detector 12 and comparing them with the beam scanning signals. The output voltage of the auxiliary lens power supply 14 is controlled by the control signals produced by the beam control unit 15 depending upon the beam diameter.

In this embodiment which makes use of a gallium liquid metal ion source, the potential of lens electrode 5b is roughly adjusted to 81.3 KV for the Ga$^+$ beam accelerated at 100 KV. Then, the potential $\Delta V_L$ is applied to the auxiliary lens electrode 16 from the auxiliary lens power supply 14, and is scanned from −100 volts to +100 volts so that the Ga+ beam assumes a minimum diameter of 0.52 μm. The potential $\Delta V_L$ at this moment is 51.3 volts, and the beam current is 0.38 nA. The time for obtaining the minimum beam diameter is 0.96 second; i.e., the focusing is accomplished quickly.

In the above-mentioned two embodiments, it was attempted to focus the ion beam. However, the same effects were also obtained even when it was attempted to arbitrarily set the beam diameter. In this case, however, the beam diameter was greater than the minimum beam diameter that was obtained by effecting the focusing.

Further, the above-mentioned two embodiments have dealt with the cases where the lens system was comprised of an electrostatic lens of a single stage. However, it needs not be pointed out that the same effects are also obtained even when the lens system is comprised of lenses of two or more stages, or even when a mass separator is installed in an ion optical system to separate the ions into those of different kinds.

According to the present invention, furthermore, the same effects are obtained even when the apparatus is used as an electron microbeam apparatus by employing an electron gun instead of the ion source.

The present invention makes it possible to accurately and quickly adjust the diameter of an ion microbeam to focus it on a sample. The invention further makes it possible to operate the apparatus highly efficiently in such applications as lithography by ions, ion implantation, and the like.

What is claimed is:

1. An ion microbeam apparatus comprising:
   an ion source;
   acceleration power supply means for accelerating ions extracted from the ion source;
   electrostatic lens means for adjusting focusing of accelerated ions, the electrostatic lens means including at least three electrodes with an intermediate electrode and at least two other electrodes disposed so that respective ones of the at least two other electrodes are arranged on opposite sides of the intermediate electrode;
   first power supply means for supplying a high potential to said intermediate electrode of said electrostatic lens means;
   ion beam diameter measuring means for measuring the diameter of an ion beam impinging on a sample and providing an output indicative thereof; and
   second power supply means for supplying a low potential to one of the at least two other electrodes of the electrostatic lens means for finely adjusting the focusing of the accelerated ions in response to the output from the ion beam diameter measuring means so as to enable the ion beam to assume an optimum diameter.

2. An ion microbeam apparatus according to claim 1, wherein the ion source includes an emitter, an ion-extracting electrode provided on the side of the sample, and ion-extracting power supply means for supplying a potential across the emitter and the ion-extracting electrode.

3. An ion microbeam apparatus according to claim 1, wherein the ion beam diameter measuring means includes ion beam deflection means disposed in proximity to the ion beam for deflecting the ion beam, secondary electron detector means for detecting secondary electrons caused by the ion beam, and beam controller means for controlling the ion beam so as to assume the optimum diameter in response to outputs from the ion beam deflection means and the secondary electron detector means.

4. An ion microbeam apparatus according to claim 1, further comprising means for maintaining the other of the at least two other electrodes of the electrostatic lens means at ground potential.

5. An ion microbeam apparatus comprising:
   an ion source;
   acceleration power supply means for accelerating ions extracted from the ion source;
   electrostatic lens means for roughly adjusting focusing of accelerated ions, the electrostatic lens means including at least three electrodes with an intermediate electrode and at least two other electrodes disposed so that respective ones of the at least two other electrodes are arranged on opposite sides of the intermediate electrode;
   first power supply means for suplying a high potential to the intermediate electrode of the electrostatic lens means;
   auxiliary electrode means arranged in proximity to one of the at least two other electrodes of the electrostatic lens means for enabling fine adjustment of the focusing of the accelerated ions;
   ion beam diameter measuring means for measuring the diameter of an ion beam impinging on a sample and providing an output indicative thereof; and
   second power supply means for supplying a low potential to the auxiliary electrode means in response to the output from the ion beam diameter measuring means so as to enable the ion beam to assume an optimum diameter.

6. An ion microbeam apparatus according to claim 5, wherein the ion source includes an emitter, an ion-extracting electrode provided on the side of the sample, and an ion-extracting power supply means for supplying a potential across the emitter and the ion-extracting electrode.

7. An ion microbeam apparatus according to claim 5, wherein the ion beam diameter measuring means includes ion beam deflection means provided in the proximity of the ion beam for deflecting the ion beam, secondary electron detector means for detecting secondary electrons caused by the ion beam, and beam controller means for controlling the ion beam so as to assume the optimum diameter in response to outputs from the ion beam deflection means and the secondary electron detector means.

8. An ion microbeam apparatus according to claim 5, further comprising means for maintaining the at least two other electrodes of the electrostatic lens means at ground potential.

* * * * *